(12) United States Patent
Farnworth et al.

(10) Patent No.: US 8,680,680 B2
(45) Date of Patent: *Mar. 25, 2014

(54) SEMICONDUCTOR DEVICES INCLUDING POROUS INSULATORS

(75) Inventors: Warren M. Farnworth, Nampa, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

This patent is subject to a terminal disclaimer.

(21) Appl. No.: 12/489,209

(22) Filed: Jun. 22, 2009

(65) Prior Publication Data

US 2009/0256262 A1    Oct. 15, 2009

Related U.S. Application Data

(60) Continuation of application No. 10/932,835, filed on Sep. 1, 2004, now Pat. No. 7,554,200, which is a division of application No. 10/230,712, filed on Aug. 29, 2002, now Pat. No. 7,153,754.

(51) Int. Cl.
*H01L 21/32* (2006.01)

(52) U.S. Cl.
USPC ..... 257/759; 257/632; 257/758; 257/E23.141

(58) Field of Classification Search
USPC .................. 257/760, 632, 758–759, E21.273, 257/E23.141
See application file for complete search history.

(56) References Cited

U.S. PATENT DOCUMENTS

| | | | |
|---|---|---|---|
| 4,077,922 A | 3/1978 | Farrissey et al. | |
| 4,293,634 A | 10/1981 | Monosov | |
| 4,618,504 A | 10/1986 | Bosna et al. | |
| 4,652,467 A | 3/1987 | Brinker et al. | |
| 4,798,691 A | 1/1989 | Kasai et al. | |
| 4,810,675 A | 3/1989 | Dejaiffe | |
| 5,302,456 A | 4/1994 | Matsui | |
| 5,318,797 A | 6/1994 | Matijevic et al. | |
| 5,354,611 A | 10/1994 | Arthur et al. | |
| 5,436,084 A | 7/1995 | Haluska et al. | |
| 5,483,098 A | 1/1996 | Joiner, Jr. | |
| 5,488,015 A | 1/1996 | Havemann et al. | |
| 5,492,870 A | 2/1996 | Wilcox et al. | |
| 5,569,058 A | 10/1996 | Gnade et al. | |
| 5,700,844 A | 12/1997 | Hedrick et al. | |
| 5,776,990 A | 7/1998 | Hedrick et al. | |
| 5,801,092 A | 9/1998 | Ayers | |

(Continued)

FOREIGN PATENT DOCUMENTS

| GB | 1357003 | 6/1974 |
|---|---|---|
| JP | 04106965 | 4/1992 |
| JP | 09278452 | 10/1997 |

OTHER PUBLICATIONS

Bado, Phillippe, et al., Clark-MXR, Inc., Micromachining Handbook, Version 2.2 (2001).

(Continued)

*Primary Examiner* — Thanhha Pham
(74) *Attorney, Agent, or Firm* — TraskBritt

(57) ABSTRACT

Semiconductor devices with porous insulative materials are disclosed. The porous insulative materials may include a consolidated material with voids dispersed therethrough. The voids may be defined by shells of microcapsules. The voids impart the dielectric materials with reduced dielectric constants and, thus, increased electrical insulation properties.

18 Claims, 4 Drawing Sheets

(56) References Cited

U.S. PATENT DOCUMENTS

| | | | |
|---|---|---|---|
| 5,835,987 A * | 11/1998 | Givens | 257/522 |
| 5,955,143 A | 9/1999 | Wheatley et al. | |
| 5,986,729 A * | 11/1999 | Yamanaka et al. | 349/79 |
| 6,099,894 A | 8/2000 | Holman | |
| 6,103,152 A | 8/2000 | Gehlsen et al. | |
| 6,156,651 A | 12/2000 | Havemann | |
| 6,163,066 A | 12/2000 | Forbes et al. | |
| 6,171,945 B1 | 1/2001 | Mandal et al. | |
| 6,255,156 B1 | 7/2001 | Forbes et al. | |
| 6,270,836 B1 | 8/2001 | Holman | |
| 6,270,846 B1 | 8/2001 | Brinker et al. | |
| 6,271,273 B1 | 8/2001 | You et al. | |
| 6,277,765 B1 | 8/2001 | Cheng et al. | |
| 6,277,766 B1 | 8/2001 | Ayers | |
| 6,297,459 B1 | 10/2001 | Wojnarowski et al. | |
| 6,313,518 B1 | 11/2001 | Ahn et al. | |
| 6,316,833 B1 | 11/2001 | Oda | |
| 6,319,854 B1 | 11/2001 | Aoi | |
| 6,333,556 B1 | 12/2001 | Juengling et al. | |
| 6,391,932 B1 | 5/2002 | Gore et al. | |
| 6,420,441 B1 | 7/2002 | Allen et al. | |
| 6,495,479 B1 | 12/2002 | Wu et al. | |
| 6,503,850 B1 | 1/2003 | Wallace et al. | |
| 6,559,070 B1 | 5/2003 | Mandal | |
| 6,559,071 B2 | 5/2003 | Ramos et al. | |
| 6,589,889 B2 | 7/2003 | Endisch et al. | |
| 6,719,932 B2 | 4/2004 | Clikeman et al. | |
| 7,554,200 B2 * | 6/2009 | Farnworth et al. | 257/760 |
| 2001/0054769 A1 * | 12/2001 | Raaijmakers et al. | 257/758 |
| 2003/0008989 A1 | 1/2003 | Gore et al. | |
| 2003/0012942 A1 | 1/2003 | Larsen et al. | |
| 2003/0015781 A1 | 1/2003 | Farrar | |
| 2004/0076806 A1 | 4/2004 | Miyanaga et al. | |
| 2004/0077738 A1 | 4/2004 | Field et al. | |
| 2005/0255710 A1 | 11/2005 | You et al. | |

OTHER PUBLICATIONS

Nalaskowski, Jakub, et al., Preparation of hydrophobic microspheres from low-temperature melting polymeric materials,@ J. Adhesion Sci. Technol., vol. 13, No. 1, pp. 1-17 (1999).

Tiarks, Franca, et al., Preparation of Polymeric Nanocapsules by Miniemulsion Polymerization, Langmuir, 2001, pp. 908-918, vol. 17.

Wolf et al., Silicon Processing for the VSLA Era, vol. 2, pp. 229 236 (Lattice Press, 1990).

\* cited by examiner

SEMICONDUCTOR DEVICES INCLUDING POROUS INSULATORS

CROSS-REFERENCE TO RELATED APPLICATIONS

This application is a continuation of application Ser. No. 10/932,835, filed Sep. 1, 2004, now U.S. Pat. No. 7,554,200, issued Jun. 30, 2009, which is a divisional of application Ser. No. 10/230,712, filed Aug. 29, 2002, now U.S. Pat. No. 7,153,754, issued Dec. 26, 2006.

BACKGROUND OF THE INVENTION

1. Field of the Invention

The present invention relates generally to the fabrication of semiconductor devices and, more specifically, to a method of producing an insulator with a low dielectric constant, or "low K dielectric," for electrically isolating components of an integrated circuit and the resulting insulators. More specifically, the present invention relates to methods for forming porous, low dielectric constant layers or structures in which the insulative material may initially be formed in a substantially solid and structurally sound state and is converted to a porous state once the low dielectric constant layer or structure or one or more layers or structures thereover have been processed, as well as the layers or structures so produced.

2. Background of Related Art

Integrated circuits (ICs) include transistors and other circuit elements that are configured and interconnected to provide a flow of current. For proper IC operation, the circuit elements and interconnections must be electrically isolated from other circuit elements and interconnections. Such electrical isolation has typically been accomplished by forming insulative layers and structures, or insulators, between the various circuit elements.

As consumers continue to demand portable computers with faster operation speeds and electronic devices which are more compact and have more memory, there continues to be a demand for the development of ICs that are smaller and more energy efficient. The densities of ICs generally increase in accordance with Moore's Law, which states that the number of circuit devices that fit on a chip of given dimensions doubles about every year-and-a-half to two years. As more circuit devices are placed on the chip, the distance between the various circuit devices or circuit elements gets smaller and leads to increased capacitive coupling (crosstalk) and propagation delay. To minimize the problems associated with crosstalk and propagation delay on smaller chips, while also minimizing the sizes of insulative layers and structures, better insulators must be developed.

Effective IC insulators should provide low current leakage, good mechanical strength, and low permittivity. The effectiveness of insulators is typically measured in terms of the relative dielectric constant for the material used as the insulator. Generally, a lower dielectric constant for a given material results in the given material being a better insulator. Silicon dioxide ($SiO_2$) has been extensively used as an insulator in IC devices. Silicon dioxide has a dielectric constant of about 4.0.

In contrast, air has a dielectric constant of approximately 1.0. Thus, the formation of insulators with air gaps therein (e.g., from porous dielectric materials) is desirable because the presence of the air gaps within the material reduces the overall dielectric constant between adjacent conductive structures. However, the presence of air gaps tends to reduce the mechanical strength and integrity needed by the dielectric material to support various circuit devices and components on the IC.

Examples of processes that may be used to form air gaps, or pores, in insulators are the so-called "sol-gel" processes. Sol-gel processes are typically used to fabricate porous, ceramic insulators. Because the silica-containing sol-gel structures shrink upon completion of the sol-gel process, however, relatively high porosities are needed in the initial sol-gel structures to produce an insulator with a suitable dielectric constant. However, the large number of pores present in the high porosity sol-gel structures weakens these insulators and makes them susceptible to crushing, as well as to other types of damage.

Other dielectric materials that may be made porous include various organic polymers which have dielectric constants that are less than that (about 4.0) of silicon dioxide. However, many organic polymers have lower mechanical strengths, are softer, and are more malleable than silicon dioxide, making porous insulators that have been formed from organic polymers susceptible to damage during fabrication of the IC.

Another example of porous, low dielectric constant materials are the so-called SiLK® (Silicon Low-K) materials that are produced by the Dow Chemical Company of Midland, Mich. While SiLK® purportedly has relatively small (i.e., as small as about 20 nm), closed cell pores which are uniformly distributed therethrough, temperatures on the order of about 400° C. or greater are required to cure SiLK® films. The use of such high process temperatures following the fabrication of metal structures is, however, somewhat undesirable, as exposing many of the types of metals that are used in semiconductor device fabrication processes to such high temperatures may stress, fatigue, or damage the layers or structures formed thereby. Moreover, as voids are present in SiLK® films prior to processing thereof or of overlying layers, SiLK® films are still more prone than solid films to being damaged during such processing.

An insulating material that may be mechanically processed or structurally support overlying layers during mechanical processing thereof in a substantially solid, nonporous state, then be porified to have a dielectric constant sufficiently low to meet the needs of ever-decreasing device dimensions would thus be an improvement in the art, as would methods for fabricating such a material.

SUMMARY OF THE INVENTION

The present invention includes methods for fabricating porous low dielectric constant layers and structures, or insulators, in which such insulators may initially be substantially solid and may subsequently be made porous. The low dielectric constant layers and structures that are formed at various stages of the method, as well as semiconductor device structures including such layers or structures, are also within the scope of the present invention.

In an exemplary embodiment of the method, a layer of dielectric material is formed over a semiconductor substrate. The dielectric material of the layer is initially formed to be substantially solid and nonporous. Following processing of the layer, pores may be introduced, generated, or otherwise formed in the dielectric material. By way of example only, the porous layer of dielectric material may be produced from a mixture of two materials, at least one of which is initially a liquid. The two materials may be materials that are miscible with one another and that, following mixing thereof, experience the phenomenon known as "Kirkendahl voiding," which results in the formation of voids therein. Alternatively, the two materials may comprise a first, base material and a second, sacrificial, void-forming material dispersed throughout the base material. Once the two materials are mixed together, one or both of the two materials may be at least partially solidified, then one or both of the two materials may be exposed to a catalyst or catalytic event to effect the formation of voids.

Another exemplary embodiment of the method includes forming a layer of dielectric material, or base material, which includes preformed pores, over a semiconductor substrate. The preformed pores may be in the form of hollow or material-filled (e.g., liquid-filled microspheres, dispersed and suspended therethrough. As an example of such a method, a layer of a so-called "sol-gel" with microspheres, microcapsules, or other void-including structures of appropriate size dispersed therethrough may be formed over a semiconductor device structure. The sol-gel may, for example, comprise a mixture that includes an alkoxide, water, and a solvent. The microspheres, microcapsules, or other void-including structures comprise an outer shell which may be hollow or encapsulate a sacrificial filler material. Once the sol-gel has been solidified into a substantially solid matrix and desired processes have been performed thereon or thereover, any filler within the microspheres, microcapsules, or other void-including structures may be removed, resulting in the formation of voids in the solidified sol-gel.

Additionally, the present invention includes semiconductor device fabrication processes in which an intermediate, substantially solid insulator layer is formed, the insulator layer or one or more overlying features are processed, and voids are then formed in the insulator layer or a structure that has been formed therefrom. Intermediate and finished semiconductor devices that include insulator layers according to the present invention are also within the scope of the present invention.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

The nature of the present invention, as well as other embodiments of the present invention, may be more clearly understood by reference to the following detailed description of the invention, to the appended claims, and to the several drawings herein, wherein:

DETAILED DESCRIPTION OF THE INVENTION

Figure 1A:
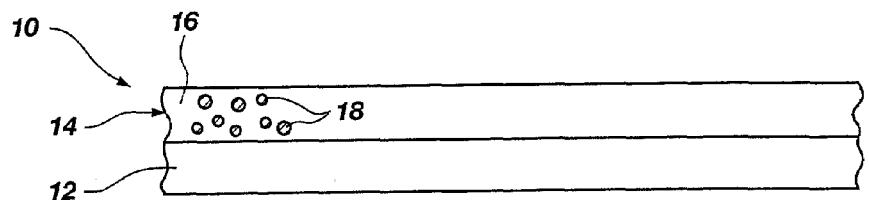
FIGS. 1A through 1D illustrate various cross-sectional views of a semiconductor device structure fabricated using a dispersion polymerization process of the present invention.

Generally, the present invention includes porous insulative materials, structures formed from the porous insulative materials, and semiconductor device structures and semiconductor devices including such porous insulative materials. The present invention also includes methods of fabricating the porous insulative materials, methods of fabricating structures that include the porous insulative materials, methods of processing the insulative materials or overlying layers of structures prior to porification thereof, and methods of fabricating semiconductor device structures and semiconductor devices that include the porous insulative materials. While the present invention is described in terms of certain specific, exemplary embodiments, the specific details of these embodiments are merely set forth in order to provide a more thorough understanding of the present invention and not as any limitation of the scope thereof. It will be apparent, however, that the present invention may be practiced in various combinations of the specific, exemplary embodiments presented herein.

In describing the following embodiments, the terms "wafer" and "substrate" include any structure having an exposed surface upon which an insulative layer or structure incorporating teachings of the present invention may be formed. The term "substrate" also includes semiconductor wafers. The term "substrate" is further used to refer to semiconductor structures during processing and may include other layers that have been fabricated thereupon. Both "wafer" and "substrate" include doped and undoped semiconductors, epitaxial semiconductor layers supported by a base of a semiconductor or an insulator, as well as other semiconductor structures known to those of ordinary skill in the art. The term "conductor" includes conductively doped semiconductors. The term "insulator" is defined to include any material that is less electrically conductive than the materials referred to herein as "conductors." The term "circuit element" is understood to include contacts to active regions of individual devices and similar active regions within a substrate or wafer. "Circuit element" also includes metal lines or layers, conductive vias, and similar conductive regions that connect individual devices within an integrated circuit.

The present invention provides a low dielectric constant, porous insulator suitable for isolation on any integrated circuit (IC), including, but not limited to, volatile and nonvolatile memory ICs, application-specific ICs, microprocessor ICs, analog ICs, digital ICs, and communication ICs. The insulator provides electrical isolation, such as between circuit elements, between interconnection lines, between circuit elements and interconnection lines, or as a passivation layer overlying both circuit elements and interconnection lines. The insulator may also be used in any other electrical device known to those of ordinary skill in the art where electrical isolation is desired.

Referring now to FIGS. 1A through 1D, there are shown various cross-sectional views of a semiconductor device structure, or semiconductor device, denoted generally at 10, where a low dielectric constant insulative layer 14 is formed by a dispersion polymerization process. As used herein, the term "semiconductor device structure" refers to both intermediate and finished semiconductor devices, with or without the addition of various circuit elements, conductive layers, and insulative layers. FIGS. 1A through 1D sequentially illustrate the intermediate semiconductor device structure, or semiconductor device 10, at various stages of an exemplary fabrication method of the present invention.

Referring now to FIG. 1A, a substrate 12, such as a substantially complete semiconductor device or a partially formed semiconductor device, is provided. Substrate 12 may comprise a full or partial semiconductor (e.g., silicon, gallium arsenide, indium phosphide, etc.) wafer, or other bulk semiconductor substrate, such as a silicon-on-insulator (e.g., silicon-on-sapphire, silicon-on-glass, silicon-on-ceramic, etc.) structure, but it will be appreciated by those of ordinary skill in the art that the substrate 12 may be any material suitable for semiconductor device 10 formation, such as a semiconductor wafer, and may be doped and/or include an epitaxial layer.

In the illustrated embodiment, an insulative layer 14 is formed on a surface, or a portion of the surface, of the substrate 12. The insulative layer 14 comprises a plurality of microcapsules 18 dispersed throughout and suspended in a liquid, or semi-liquid, insulative material 16. When the microcapsules 18 are filled with material, as described in further detail hereinafter, the insulative material 16 of insulative layer 14 is said to be in a first, substantially nonporous state.

The insulative material 16 comprises a substantially nonvaporizable material under conditions to which the semiconductor device 10 will be exposed and may comprise any electrically nonconductive material, including both polymers and nonpolymers, known to those of ordinary skill in the art and suitable for use as a dielectric layer or structure in a semiconductor device. In the illustrated embodiment, the insulative material 16 is an organic polymer. Polymers that may be used as insulative material 16 include, but are not limited to, polyimide, polybenzoxazole, polyquinoline, polypropylene, polyurethane, nylon, polyethylene, or epoxies, as well as any other organic polymer, elastomer, or resin that is nonconductive and known to those of ordinary skill in the art. Nonpolymeric materials that may be used as the insulative material 16 include, but are not limited to, silica aerogels, mesoporous silicas, and other nonconductive nonpolymeric materials that are known to those of ordinary skill in the art. Also within the scope of the present invention is a combination of a polymer with a silica aerogel or mesoporous silica for use as the insulative material 16. Depending on the type of substrate 12 and insulative material 16 used, binding of the insulative material 16 to the substrate 12 may be augmented with an adhesion layer (not shown) suitable for use with the materials of the substrate 12 and the insulative material 16, as known to those of ordinary skill in the art. Alternatively, or in addition to the use of an adhesion material, the surface of the substrate 12 may be treated or modified (e.g., roughened by use of an etchant, laser ablation, or otherwise as known in the art) to enhance the adhesion of the insulative material 16 thereto.

Figure 1B:
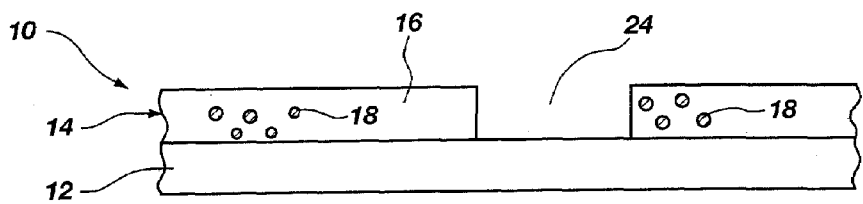
Figure 1C:
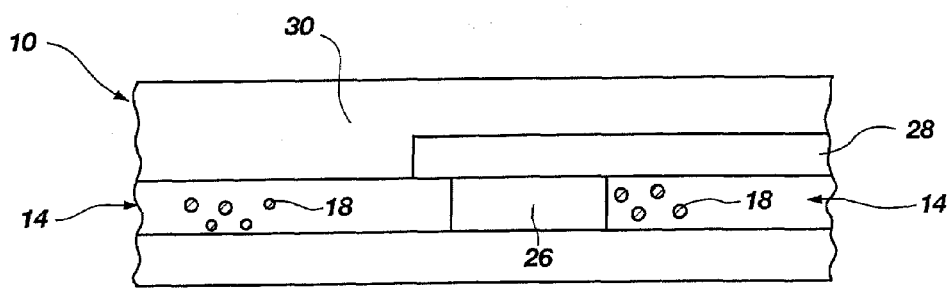
Figure 1D:
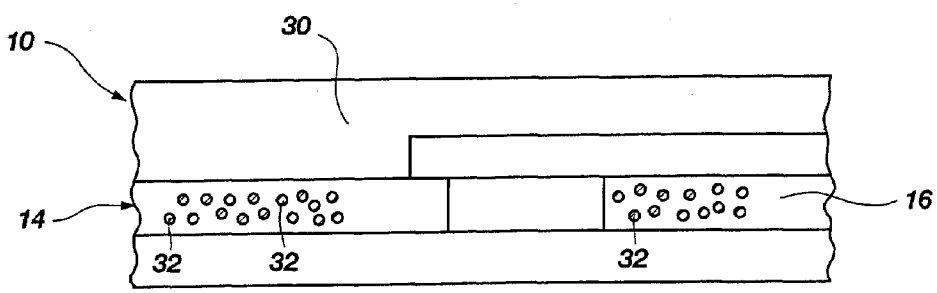
Figure 2:
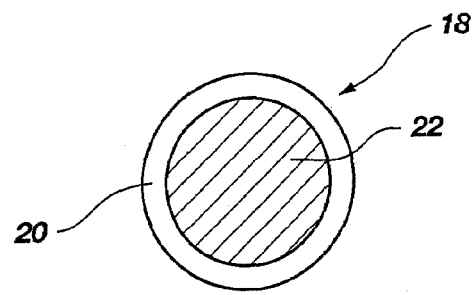
FIG. 2 depicts a cross-sectional view of a microcapsule used in an exemplary embodiment of the methods of the present invention.

Referring now to FIG. 2, there is shown a cross section of an exemplary microcapsule 18 that may be used in the method depicted in FIGS. 1A-1D. The microcapsule 18 comprises an outer shell 20 that encapsulates a filler 22. The outer shell 20 may comprise any material that is substantially nonreactive with the filler 22 and the insulative material 16. Examples of materials that may be used for the outer shell 20 include, but are not limited to, plastics such as poly-methyl-methacrylate (PMMA) and polyvinyl chloride (PVC). However, it will be apparent to those of ordinary skill in the art that any material which functions the same as, or equivalent to, the plastics described herein are encompassed by the present invention. In the illustrated embodiment, the filler 22 may be in liquid form and comprise a material that is substantially nonvaporizable under selected ambient conditions (e.g., particular temperatures and/or pressures). However, it will be apparent to those of ordinary skill in the art that the filler 22 may be any substance that is nonvaporizable under the selected ambient conditions and does not dissolve or react with the outer shell 20. Solids that are sublimable under the selected conditions may also be used as the filler 22, such that the solid possesses the same characteristics as the liquid described herein. Examples of liquid solvents that may be used as the filler 22 include, but are not limited to, water, acetone, N-methylpyrrolidone (NMP), and various alcohols. In an alternative embodiment, two or more different fillers 22 possessing different evaporation temperatures may be used in different or the same shells. Microcapsules 18 may be formed by a variety of methods, such as by known drip or jet co-extrusion processes, by miniemulsion polymerization processes, such as those described in Tiarks, F. et al., "Preparation of Polymeric Nanocapsules by Miniemulsion Polymerization," LANGMUIR, 17:908-18 (2001) (hereinafter "Tiarks"), by the process described in Nalaskowski, J., et al., "Preparation of Hydrophobic Microspheres from Low Temperature Melting Polymeric Materials," J. Adhesion Sci. Technol., 13(1):1-17 (1999) (hereinafter "Nalaskowski"), or as otherwise known in the relevant art. The disclosures of Tiarks and Nalaskowski are hereby incorporated herein by this reference in their entireties.

Referring again to FIG. 1A, the insulative layer 14 is formed on the substrate 12 in a liquid or semi-liquid form. In the illustrated embodiment, the insulative layer 14 comprises the insulative material 16 in liquid form with the microcapsules 18 suspended in and dispersed throughout the liquid insulative material 16. The liquid insulative material 16 and suspended microcapsules 18 are applied to the substrate 12 in a manner known to those of ordinary skill in the art, such as a spin-on technique, mechanical process (e.g., the use of a doctor blade), or any other known processes that may be used to fabricate or form a layer.

Once the insulative layer 14 is disposed on the substrate 12, the insulative material 16 is allowed or caused to set or solidify, such that the insulative layer 14 forms a substantially solid matrix around the microcapsules 18. In the illustrated embodiment, the selection of the insulative material 16, outer shell 20, and filler 22 is based, at least in part, on the temperature at which the insulative material 16 solidifies and the evaporation, or vaporization, temperature of the filler 22. It will be further appreciated that the selection of insulative materials 16 (e.g., resins and polymers), substrates 12, metals for circuit elements, and other materials (e.g., plastics for the outer shells 20) used in the semiconductor device 10 fabricated herein will be such that the thermal mismatch or differences between coefficients of thermal expansion of the various materials will be minimized. Ideally, the temperature at which the insulative material 16 solidifies is lower than the evaporation point of the filler 22, such that the insulative material 16 will set into the solid matrix before the filler 22 turns into vapor. For example, if water were used as the filler 22, the insulative material 16 used would have a solidification temperature that is below the evaporation temperature of water, or 100° C., and also be a temperature compatible with the outer shell 20. It will be appreciated by those of ordinary skill in the art that, depending on the insulative material 16 used, a soft bake may be used to set the insulative material 16, wherein the temperature of the soft bake does not vaporize the filler 22. For example, polyamide may be used as the insulative material 16, polymethyl methacrylate (PMMA) may be used as the outer shell 20, and water may be used as the filler 22. In this example, the polyamide could be soft baked at 65° C. for about 1 to 2 hours. Since 65° C. is a lower temperature than the evaporation temperature of water, the filler 22 in the outer shell 20 will remain intact as a liquid.

Referring now to FIG. 1B, there is shown the semiconductor device 10 after the insulative material 16 has formed the substantially solid matrix. As illustrated in FIG. 1B, a patterning process may be employed to remove portions 24 of the insulative layer 14 that overlie the substrate 12, such that isolation regions, circuit elements, or other conductive elements may be formed in the removed portion 24 of the insulative layer 14. It will be appreciated that any suitable method of patterning an IC component, such as a photolithographic patterning process (if the insulative material 16 is a photoimagable material), a trench-and-fill process, or a mask and etch technique (using an etchant suitable for the insulative material 16) may be used to pattern the insulative layer 14 and/or the substrate 12 and not depart from the spirit of the present invention. Alternatively, or in addition, the surface of the insulative layer 14 and/or the surface of the substrate 12 may be planalized using known abrasive planarization techniques, such as mechanical planarization, chemical-mechanical planarization, or chemical-mechanical polishing, to polish and smooth the surface. It will be apparent to those of ordinary skill in the art that the filler 22 in the microcapsules 18 provides mechanical strength to the semiconductor device 10, such that during such patterning and planarization processes, as well as during fabrication of various circuit elements (e.g., by planarizing and patterning of layers subsequently formed on the semiconductor device 10), the insulative layer 14 is able to withstand compressive and other mechanical stresses placed thereon.

Referring now to FIG. 1C, there is shown the semiconductor device 10 after circuitry has been fabricated, as known in the art, at least partially over the insulative layer 14. A conductive material 26 has been placed in the portion 24 of the insulative layer 14 that was removed overlying the substrate 12. Other circuit elements and/or layers may be added to the semiconductor device 10 as known to those of ordinary skill, such as the deposition and patterning of a conductive (e.g., polysilicon) layer 28 or another dielectric layer 30, as known in the art.

Referring now to FIG. 1D, there is shown the semiconductor device 10 after voids 32 have been formed in the insulative material 16 when the insulative material 16 is in a second, porous state. In the illustrated embodiment, the voids 32 are formed by exposing the semiconductor device 10 and the insulative layer 14 to appropriate conditions, referred to herein as "catalysts," for removing the filler 22 from the outer shells 20. Of course, the selection of the materials used as insulative material 16 and as outer shells 20 of the microcapsules 18 will correspond to the selection of the filler 22 such that the outer shell 20 and the insulative material 16 will allow the vaporized filler 22 to diffuse out of the microcapsules 18 and out of insulative layer 14. The type of filler 22 used dictates the "catalyst" that will be used to remove the filler 22. For example, the "catalyst" for removing a liquid filler 22 may create conditions which vaporize or condense the liquid filler 22, while the "catalyst" for removing a solid filler 22 may create sublimation conditions. Heat, electromagnetic frequencies such as ultraviolet (UV) light, radio waves produced by a microwave source, or any other known "catalyst" may be employed to remove the filler 22 and create voids 32 within the microcapsules 18 of insulative layer 14. In the illustrated embodiment, the filler 22 may be vaporized by heating the semiconductor device 10. When the semiconductor device 10 is heated to at least a vaporization temperature of the filler 22 (e.g., to a temperature of at least about 100° C. when the filler 22 comprises water), the vaporized filler 22 diffuses through the outer shell 20 of the microcapsule 18 and into the surrounding insulative material 16. Depending on the type of filler 22 used, the filler 22 vapor may diffuse completely out of the semiconductor device 10, or removal of the filler 22 vapor may be aided by placing the semiconductor device 10 in a vacuum to draw the vapor out of the semiconductor device 10.

The initial process (e.g., a soft bake process) used to substantially solidify the insulative layer 14 may not fully cure the insulative layer 14, depending upon the type of material used as the insulative material 16. A final solidification or cure of the insulative material 16 may be accomplished simultaneously when the filler 22 is vaporized for optimum efficiency, or, alternatively, before or after the filler 22 is removed. The filler 22 may more readily escape insulative layer 14 or structures formed therefrom if the insulative material 16 has not yet been fully solidified. In various alternative embodiments and depending upon the type of insulative material 16 used, a hard bake or other known curing process may be used to more fully solidify or cure the insulative layer 14 before completion of the circuitry on the semiconductor device 10. The final cure may occur before removal of the filler 22, after the ICs have been completed on the semiconductor device 10, or at any other appropriate time apparent to those of ordinary skill in the art and consistent with the fabrication processes employed to manufacture the semiconductor device.

The selection of the filler 22 and the catalyst used to remove the filler 22 also takes into consideration the substrate 12 and other features of the semiconductor device 10, such as the various circuit elements and other components thereof, such that the process of vaporizing, or otherwise removing, the filler 22 does not damage any of the circuit elements or other components. For example, if aluminum were used in the semiconductor device 10, then the temperature selected to vaporize the filler 22 should not exceed 470° C. because the aluminum may oxidize or even melt. Additionally, the catalyst selected to remove the filler 22 should not cause the voids 32 formed in insulative layer 14 to collapse or to be filled with material.

In a variation of this embodiment, the outer shells 20 of the microcapsules 18 may comprise a material that deteriorates, loses some structural integrity or otherwise becomes more permeable to the filler 22 after a period of time or when exposed to a particular catalyst or combination of catalysts. If the outer shell 20 starts to or is caused to deteriorate prior to removal of the filler 22, then the filler 22 may begin to diffuse into the surrounding insulative material 16 before the catalyst is applied, which may make removal of the filler 22 more efficient.

Optionally, microcapsules 18 may be substantially hollow and filled with gas or air, in which case it is not necessary to remove material therefrom to create voids 32 within insulative layer 14. If substantially spherical microspheres are used as microcapsules 18, an insulative layer 14 which includes such microcapsules 18 may withstand substantial forces exerted thereon during processing (e.g., polishing) thereof, as well as during processing of overlying layers or structures. By way of example only, microcapsules 18 may comprise acrylic microspheres, which are commercially available from a variety of sources and in a variety of sizes.

A two-part resin may be used as the insulative material 16. A first part of the resin may be a UV-curable component of the resin such that the matrix is substantially solidified by UV curing the first part of the resin, while a second part of the resin remains at least semi-liquid. In the final cure, the second part of the resin may be cured using heat, or any other catalyst.

An example of this embodiment includes use of a so-called "sol-gel" and is illustrated in FIGS. 4A through 4D. In FIGS. 4A through 4D, there are shown various cross-sectional views of a semiconductor device 210 fabricated using another embodiment of the present invention wherein a microencapsulated filler is used to form voids in an insulative layer 214 derived from a sol-gel solution.

Figure 4A:
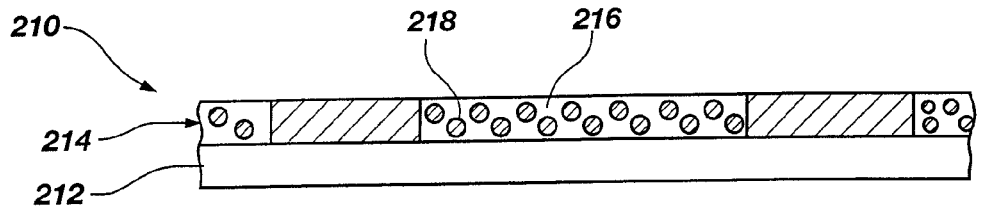
FIGS. 4A through 4D illustrate various cross-sectional views of a semiconductor device structure fabricated using a microencapsulated filler suspended in a sol-gel in accordance with the methods of the present invention.

Referring now to FIG. 4A, a substrate 212 is provided with a sol-gel solution 216 dispersed thereon. It will be appreciated that methods of sol-gel chemistry used to produce porous films on semiconductor devices are well known to those of ordinary skill in the art. In a typical sol-gel process, a silicon, metal, or metalloid alkoxide is subjected to hydrolysis and condensation reactions to form a gel containing a continuous solid phase of the corresponding silicon, metal, or metalloid oxide. The gel is filled with a solvent and other liquid reactants that are subsequently removed to form a solid matrix, which, in the present invention, may include a plurality of micropores dispersed therethrough.

The sol-gel solution 216 used in the present invention may, for example, comprise an insulative base material, such as a silicon oxide (e.g., glass or undoped silicon dioxide), a metal oxide (e.g., a ceramic), or a metalloid alkoxide, as well as water, a solvent, such as alcohol, and a plurality of microcapsules 218 comprising the outer shell 20 encapsulating the filler 22 as shown in FIG. 2. The microcapsules 218 are substantially evenly dispersed throughout the sol-gel solution 216. Metal alkoxides that may be used include, but are not limited to, alkoxysilanes, such as tetramethoxysilane (TMOS) and tetraethoxysilane (TEOS). Other alkoxides that may be used include, but are not limited to, aluminates, titanates, borates, and metalloid alkoxides as known to those of ordinary skill in the art. It will be appreciated by those of ordinary skill in the art that the water in the sol-gel solution 216 causes the hydrolysis reaction and the alcohol causes the condensation reaction. The rate of hydrolysis, condensation, and linking of the particles in the sol-gel solution 216 may be controlled and optimized by varying the pH of the sol-gel solution, the use of a catalyst (e.g., mineral acids and ammonia), varying the amount of water, varying the amount of solvent, and varying the amount of alkoxides. Because the sol-gel reaction may take place at a relatively low temperature (e.g., room temperature), the filler 22 of the microcapsule may comprise a material with a relatively low vaporization point, such as water, a solvent, or an alcohol. In the present embodiment, the outer shell 20 comprises a plastic, such as PMMA or PVC, that is impermeable to the constituents of the sol-gel solution 216 and the filler 22 used in the microcapsule 218.

Figure 4B:
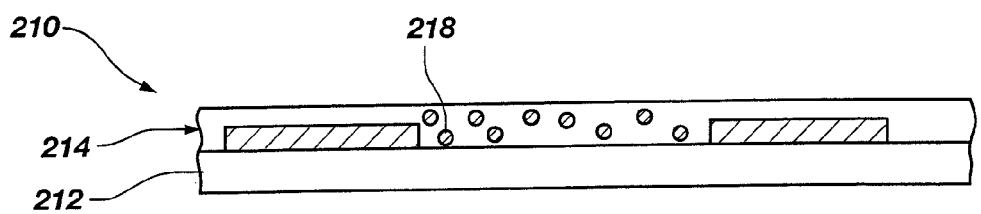

Referring now to FIG. 4B, there is shown the semiconductor device 210 once the sol-gel solution 216 has hydrolyzed and condensed such that the particles in the sol-gel solution 216 have formed chemical bonds and are linked together in a substantially solid matrix. The sol-gel process produces porous layers with fine particle sizes (2-10 nm) and porosities of approximately 70-99%. Since the microcapsules 218 were suspended in and dispersed throughout the sol-gel solution 216, the matrix formed by the sol-gel solution 216 is formed around the microcapsules 218. Once the formation of bonds is complete in the sol-gel solution 216, an insulative layer 214 is formed comprising the matrix of the sol-gel solution 216 which includes a plurality of micropores formed throughout the matrix, and further includes the embedded microcapsules 218.

The insulative layer 214 may be planarized in any manner known to those of ordinary skill in the art to impart the insulative layer 214 with a desired thickness. The insulative layer 214 may also be patterned, such as by forming damascene trenches (not shown) for the placement of circuit elements or other recesses. It will be apparent to those of ordinary skill in the art that the presence of the microcapsules 218, filled with the filler 22 (FIG. 2), provides strength and structural integrity to the insulative layer 214 formed from the sol-gel solution 216. Thus, the filler 22 prevents the insulating layer 214 from being crushed or damaged during the planarizing and patterning thereof.

Figure 4C:
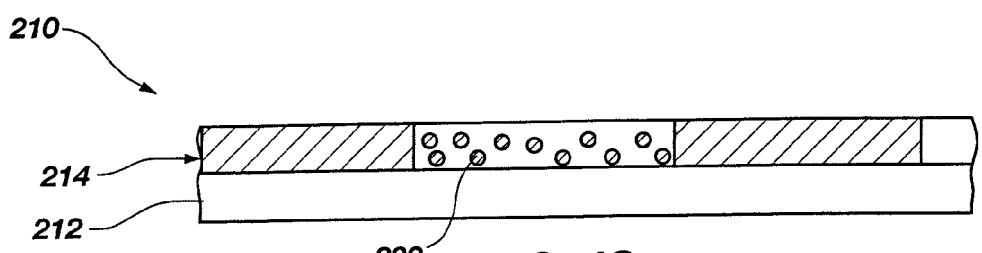

Referring now to FIG. 4C, there is shown a cross section of the semiconductor device 210 after the insulative layer 214 has been planarized to a desired thickness and the filler 22 of the microcapsules 218 has been removed. When the filler 22 is removed, voids 232, or pores, are created in the insulative layer 214. The filler 22 may be removed from the microcapsules 218, for example, by one of the above-described processes. By way of example only, when the filler 22 is water, the semiconductor device 210 may be heated to vaporize the water. The water will begin to diffuse out of the microcapsule 218 at about 50° C. However, care in heating the semiconductor device 210 when water is used as the filler 22 should be used because if the temperature used to vaporize the water exceeds 90° C. too quickly, the water and, thus, the microcapsules 218 may expand and damage the insulative layer 214. Once the water has vaporized, a plurality of voids 232 will remain in the insulative layer 214 and further decrease the dielectric constant of the insulative layer 214. It will be further appreciated that the semiconductor device 210 may be placed in a vacuum to draw the vapor out of the semiconductor device 210 as previously described herein.

Figure 4D:
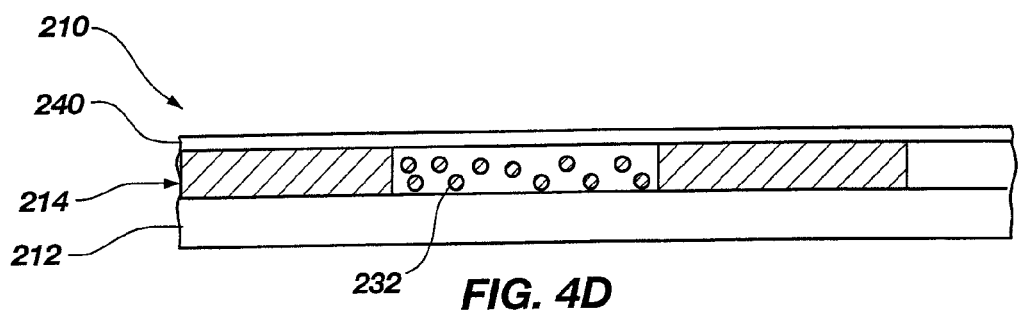

Referring now to FIG. 4D, circuit elements of the semiconductor device 210 may be fabricated, such as by depositing a metal coating 240 onto the surface of the insulative layer 214 using methods known to those of ordinary skill in the art, such as by chemical vapor deposition (CVD), plasma enhanced chemical vapor deposition (PECVD), rapid thermal chemical vapor deposition (RTCVD), atomic layer deposition (ALD), or physical vapor deposition (PVD). As known to those of ordinary skill in the art, the metal coating 240 may be subsequently patterned (e.g., by masking and etching) to define various circuit elements therefrom.

With continued reference to FIGS. 4A through 4D, as well as to FIGS. 1A through 1D, fabrication of the insulative layer 14, 214 using the methods described herein provides a finely and evenly distributed plurality of micro-sized voids 32, 232 in the insulative layer 14, 214, which substantially lowers the dielectric constant of the insulative layer 14, 214. The effectiveness of the insulative layer 14, 214 as a dielectric may be determined based on factors including, but not limited to, the size, number, and distance between the microcapsules 18, 218 used to create the voids 32, 232 in the insulative material 16, sol-gel solution 216 and the thickness and type of insulative material 16, sol-gel solution 216 used in the insulative layer 14, 214.

Figure 3A:
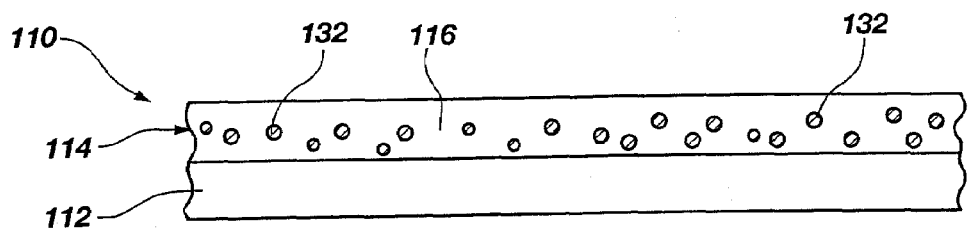
FIGS. 3A and 3B show two cross-sectional views of a semiconductor device structure manufactured using a seed emulsion process.
Figure 3B:
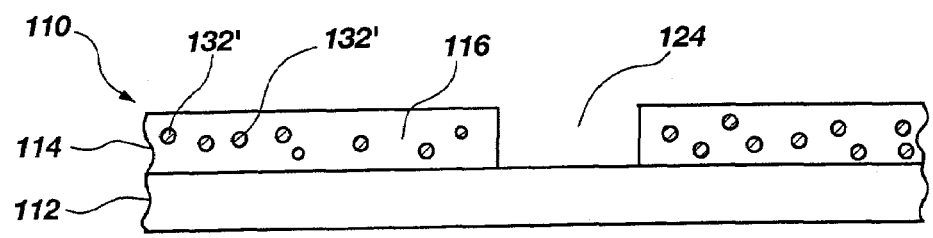

Referring now to FIGS. 3A and 3B, there is shown a cross-sectional view of a semiconductor device 110 fabricated with an insulative layer 114 produced using another embodiment of the present invention, or a seed emulsion process, which is also referred to herein as an "emulsion process." In the emulsion process, two nonconductive materials in a liquid, or semi-liquid, state are mixed together to form a mixture.

In an example of the emulsion process, depicted in FIG. 3A, a hydrophilic nonconductive liquid may be mixed with a hydrophobic nonconductive liquid to form an emulsion, wherein globules 132 of one of the hydrophobic nonconductive liquid and the hydrophilic nonconductive liquid are formed in and surrounded by a matrix material 116 which may comprise the other of the hydrophilic and hydrophobic nonconductive liquids, as depicted in FIG. 3A. By way of example only, the hydrophobic nonconductive liquid may comprise uncured PMMA, while the hydrophilic nonconductive liquid may comprise deionized water or a low molecular weight alcohol (e.g., methanol, ethanol, propanol, etc.). The emulsion is deposited on a substrate 112 in a manner known to those of ordinary skill in the art, such as a spin-on technique, mechanical process (e.g., the use of a doctor blade), or any other known processes that may be used to fabricate or form a layer with a substantially planar surface and having a substantially uniform thickness over the surface of the substrate 112. After dispersion of the emulsion onto the substrate 112, the matrix material 116 (e.g., PMMA) is caused to at least partially set or allowed to at least partially set to form a substantially solid matrix that surrounds the globules 132 of hydrophobic liquid which have been substantially evenly dispersed therethrough. Depending on the type of matrix material 116 used to form the emulsion, the matrix material 116 may require a soft bake, a period of time, exposure to a particular wavelength of electromagnetic radiation (e.g., light), exposure to a chemical catalyst (as in a two-part epoxy resin), or exposure to any other catalyst suitable for substantially solidifying the same. It will be further appreciated that the surface of the substrate 112 may be modified, as known in the art, to facilitate adhesion of the insulative layer 114 thereto or that an adhesion layer may be used to augment binding of the insulative layer 114 to the substrate 112 as is known in the art. At this point, the materials of insulative layer 114 are in a first, substantially nonporous state.

Referring to FIG. 3B, there is shown the semiconductor device 110 after the matrix material 116 has set into a substantially solid matrix. After the matrix material 116 has been formed into the substantially solid matrix, the insulative layer 114 and substrate 112 of the semiconductor device 110 may be planarized or patterned in the same manner as previously described herein for the subsequent formation of various IC elements. For example, as shown in FIG. 3B, a portion 124 of the insulative layer 114 may be removed for the addition of a circuit element (not shown). Structures, such as circuit elements, may also be fabricated over or adjacent to the insulative layer 114.

Once the circuit elements or other structures have been formed, void 132' initiation may be started by applying an appropriate catalyst to the semiconductor device 110, transforming the material of the insulative layer 114 to a second, porous state. The catalyst may be in the form of certain light frequencies (e.g., UV), radio waves (e.g., use of a microwave), heat, or any other method of removing (e.g., by vaporization, condensation, sublimation, etc.) globules 132, thereby catalyzing void 132' formation. The catalyzation technique that is used depends, of course, upon the type of material that forms the globules 132. Diffusion of the material of the globules 132 may be effected by placing the semiconductor device 110 in a negative pressure (i.e., a vacuum) to facilitate drawing out of the material from which the globules 132 are formed.

Once the matrix material 116 has solidified, the insulative layer 114 may be planarized and patterned, and IC elements may be fabricated on the semiconductor device 110 as previously described herein. The insulative layer 114 may then be exposed to a second catalyst, such as a hard bake, so voids 132' are produced in the space, or interface, between the filler liquid and the carrier liquid. In the illustrated embodiment, the filler liquid may shrink, or condense, as it cures to cause voids 132' to form in the insulative layer 114. The temperature for the hard bake is selected such that the matrix material 116 (formed from the solidifying of the carrier liquid) is not heated to too high a temperature to prevent the matrix from collapsing in on the voids 132'. Because the carrier liquid was previously solidified to form the matrix material 116, the shrinking or removal of the filler liquid causes the void 132' formation.

In a second example of the seed emulsion process, two nonconductive liquids that are miscible in each other may be combined to form a mixture of the liquids. When the two liquids diffuse into each other, an interface may form between the two liquids. Voids 132' may form at the interface between the two nonconductive materials much like the formation of Kirkendahl voids at an interface between gold and aluminum when gold and aluminum diffuse into each other. By way of example, voids 132' may be formed at the interfaces of globules 132 with matrix material 116, as at least the matrix material 116 begins to solidify or cure. Of course, the use of miscible material combinations in which void formation may occur is also within the scope of the present invention when such void formation occurs before or after one or both of the matrix material 116 and the material from which the globules 132 are formed begins to solidify or cure, provided that the voids 132' remain dispersed substantially evenly throughout the matrix material 116 once it has become at least semisolid. Subsequent processing of insulative layer 114 or overlying layers or structures may be effected, as described above, prior to the formation of voids 132' in insulative layer 114.

As an alternative to the use of seed emulsion processes to effect the formation of voids at interfaces between miscible materials, and with reference again to FIGS. 1A through 1D, the insulative material 16 of insulative layer 14 may be miscible with the filler 22 (FIG. 2) of microcapsules 18. The material from which the outer shells 20 (FIG. 2) of the microcapsules 18 is formed may deteriorate or become or be made permeable (e.g., over time, when exposed to appropriate catalytic conditions, etc.), resulting in contact and, thus, an interface between insulative material 16 and filler 22. Again, voids 32 may be formed at such an interface. The formation of such voids 32 may occur before, during, or after curing or solidification of one or both of insulative material 16 and filler 22.

Turning now to FIGS. 5A through 5D, another exemplary embodiment of a method for forming porous dielectric layers and structures is depicted. The method depicted in FIGS. 5A through 5C employs known, ultrafast laser pulsing techniques, in which a laser beam which is pulsed at an ultrafast frequency is focused at a location within a layer 314 of dielectric material.

Figure 5A:
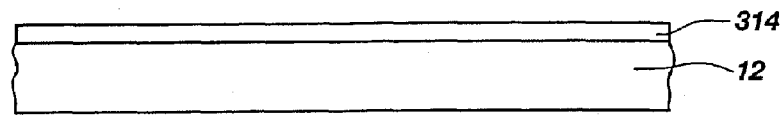
FIGS. 5A through 5D depict another exemplary method for forming voids in a material layer, by which an ultrafast laser pulse is used to form the voids within a layer or structure of dielectric material.

In FIG. 5A, a layer 314 of dielectric material, such as doped silicon dioxide (i.e., a glass, such as borosilicate glass (BSG), phosphosilicate glass (PSG), or borophosphosilicate glass (BPSG)), undoped silicon dioxide, silicon nitride, silicon oxynitride, a dielectric polymer, or the like, in a first, substantially nonporous state is formed over a substrate 12 by known, suitable processes. For example, when layer 314 comprises glass, silicon dioxide, silicon nitride, or silicon oxynitride, any known deposition techniques may be used. As another example, if a dielectric polymer is used to form layer 314, spin-on processes, the use of a doctor blade, or screen printing processes may be used. It is currently preferred that the material from which layer 314 is formed be transparent at least to the wavelength or wavelengths of electromagnetic radiation that comprise an ultrafast pulsed laser beam 330 (FIG. 5C) to be focused therein.

Figure 5B:
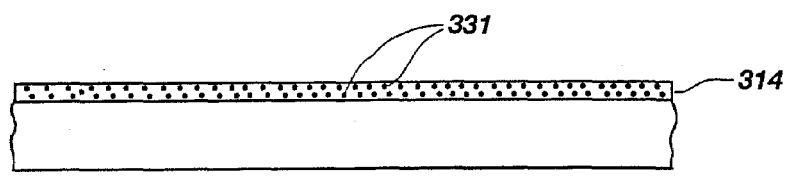

As shown in FIG. 5B, focal points 331, which are locations at which voids 332 (FIG. 5C) are desired, are selected or otherwise determined (e.g., randomly, in a pattern, etc.) within the interior of layer 314. Each focal point 331 represents a location at which photons will be absorbed and form a plasma within the material of layer 314.

Figure 5C:
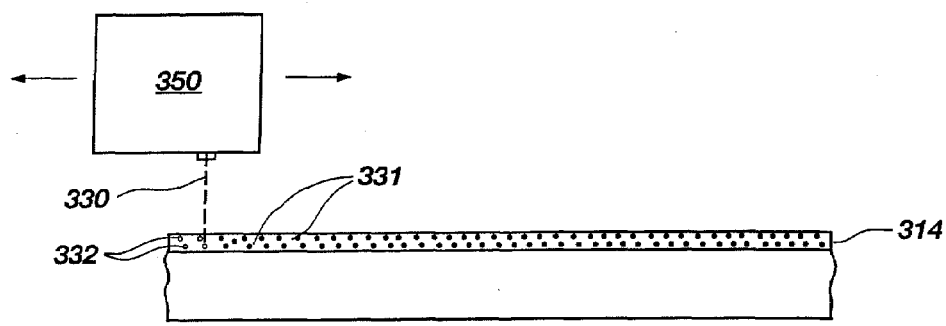

FIG. 5C schematically depicts use of a so-called ultrafast pulsed laser beam 330 (e.g., pulses having a frequency of about one pulse per femtosecond ($10^{-15}$ second)) to form voids 332 at focal points 331 within layer 314. Ultrafast pulsed laser beam 330 may be generated by an ultrafast pulsed laser machine 350, such as the model CPA-2001 femtosecond laser available from the Ultrafast Laser Machining Division of Clark-MXR, Inc., of Ann Arbor, Mich.

Figure 5D:
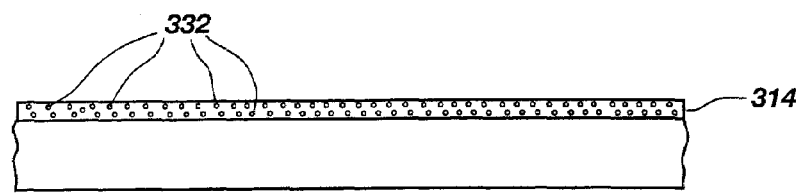

Since focal points 331 are located within layer 314, an ultrafast pulsed laser beam 330 may be focused at such internally confined focal points 331 in such a way that the intensity of ultrafast pulsed laser beam 330 does not exceed an intensity threshold of the material from which layer 314 is formed until it reaches each focal point 331. When ultrafast pulsed laser beam 330 reaches a focal point 331, however, the intensity thereof reaches or exceeds the intensity threshold for the material of layer 314, causing the material of layer 314 at that focal point 331 to absorb the energy of ultrafast pulsed laser beam 330. The absorption of energy by the material of layer 314 at each focal point 331 results in the formation of a plasma at that focal point 331 and, thus, the removal of material of layer 314 and the formation of a void 332 at each focal point 331, as depicted in FIG. 5D. The use of ultrafast pulsed laser machine 350 (FIG. 5C) in this manner is described in Clark-MXR, Inc., Micromachining Handbook, which is available from Clark-MXR, Inc., the disclosure of which is hereby incorporated herein in its entirety by this reference. When voids 332 are formed in layer 314, the material of layer 314 is transformed from the first, substantially nonporous state to a second, porous state.

Voids 332 of desired size (e.g., diameter) may be formed by use of an ultrafast pulsed laser beam of an appropriate wavelength. By way of example only, an ultrafast pulsed laser beam 330 having a central wavelength of about 0.2 µm, or microns (i.e., about 200 nm), may be used to form voids 332 that measure about 0.02 µm (i.e., about 20 nm or 200 Å) across.

Of course, other features, including, without limitation, circuit elements (not shown), may be formed over layer 314 or the structures that have been formed therefrom, as described previously herein with reference to FIGS. 1D and 4D. Such fabrication may be effected once voids 332 have been formed or, if the materials from which the other features are to be fabricated are substantially transparent to the wavelengths of the ultrafast pulsed laser beam 330 to be used, prior to the formation of voids 332 within layer 314.

The teachings of the present invention are applicable to the fabrication of any dielectric layer or structure of a semiconductor device. At present, these methods are particularly useful for forming insulative structures that will electrically isolate conductive structures, such as redistribution circuitry and redistributed bond pads to be fabricated over the active surfaces of semiconductor devices that have been substantially completely fabricated, from the integrated circuitry of such semiconductor devices.

Although the present invention has been shown and described with respect to illustrated embodiments, various additions, deletions and modifications that are obvious to a person of ordinary skill in the art to which the invention pertains, even if not shown or specifically described herein, are deemed to lie within the scope of the invention as encompassed by the following claims.

What is claimed is:

1. A semiconductor device structure, comprising:
    a substrate comprising a semiconductor material; and
    a structure over the substrate, comprising:
        a dielectric material having a substantially uniform thickness; and
        a plurality of discrete, spherical, hollow microcapsules at least substantially suspended in the dielectric material, at least one microcapsule of the plurality located on a different longitudinal plane and a different lateral plane than at least one other microcapsule most proximate the at least one microcapsule, each microcapsule of the plurality of microcapsules having a continuous, imperforate outer shell comprising at least one of an acrylate polymer and a vinyl polymer surrounding an interior devoid of filler material.

2. The semiconductor device structure of claim 1, wherein the structure over the substrate comprises a discernable boundary at an interface between each discrete, spherical, hollow microcapsule of the plurality of discrete, spherical, hollow microcapsules and the dielectric material.

3. The semiconductor device structure of claim 1, wherein the dielectric material comprises a plastic.

4. The semiconductor device structure of claim 1, wherein the dielectric material comprises at least one of a polyimide, a polybenzoxazole, a polyquinoline, a polypropylene, a polyurethane, a nylon, a polyethylene, an epoxy, a silica aerogel, a mesoporous silica, and a sol-gel.

5. The semiconductor device structure of claim 1, further comprising:
    at least one conductive element over the substrate.

6. The semiconductor device structure of claim 5, wherein the at least one conductive element is at least partially covered by the structure.

7. The semiconductor device structure of claim 5, wherein the at least one conductive element is at least partially supported by the structure.

8. The semiconductor device structure of claim 1, wherein the substrate comprises a semiconductor die.

9. A semiconductor device structure, comprising:
    a substrate comprising a semiconductor material; and
    a structure on the substrate, comprising:
        a dielectric material; and
        a plurality of discrete microcapsules, each discrete microcapsule of the plurality of discrete microcapsules comprising:
            a continuous and imperforate outer shell comprising at least one of an acrylate polymer and a vinyl polymer; and
            an interior devoid of a filler material;
    wherein each discrete microcapsule of the plurality of discrete microcapsules is at least substantially surrounded by and discernable from the dielectric material.

10. The semiconductor device structure of claim 9, further comprising at least one conductive element over the substrate and at least partially supported by the structure.

11. The semiconductor device structure of claim 9, wherein the plurality of discrete microcapsules is dispersed throughout the dielectric material.

12. The semiconductor device structure of claim 9, wherein the continuous and imperforate outer shell comprises at least one of poly-methyl-methacrylate and polyvinyl chloride.

13. A semiconductor device structure, comprising:
    a substrate comprising a semiconductor material; and
    at least one dielectric structure overlying the substrate, the at least one dielectric structure having substantially planar opposing surfaces and comprising:
        a dielectric material; and
        a plurality of discrete microcapsules dispersed throughout the dielectric material such that a majority of adjacent discrete microcapsules of the plurality are located on different lateral planes and different longitudinal planes, each discrete microcapsule of the plurality having a continuous and imperforate wall comprising at least one of an acrylate polymer and a vinyl polymer and defining a void free of a filler material.

14. The semiconductor device structure of claim 13, wherein discrete boundaries exist between the plurality of discrete microcapsules and the dielectric material.

15. The semiconductor device structure of claim 14, wherein the plurality of discrete microcapsules is at least substantially enveloped by the dielectric material.

16. The semiconductor device structure of claim 13, wherein the plurality of discrete microcapsules comprises a different material than the dielectric material.

17. The semiconductor device structure of claim 13, wherein the plurality of discrete microcapsules comprises a same material as the dielectric material.

18. A semiconductor device structure, comprising:
   a substrate comprising a semiconductor material; and
   at least one dielectric structure overlying the substrate, the at least one dielectric structure having substantially planar opposing surfaces and comprising:
      a dielectric material; and
      a plurality of discrete microcapsules dispersed laterally and longitudinally throughout the dielectric material, each discrete microcapsule of the plurality of discrete microcapsules comprising a continuous and imperforate wall of at least one of poly-methyl-methacrylate and polyvinyl chloride defining a void free of a filler material.

\* \* \* \* \*